(12) United States Patent
Hausmann

(10) Patent No.: US 6,215,640 B1
(45) Date of Patent: Apr. 10, 2001

(54) APPARATUS AND METHOD FOR ACTIVELY CONTROLLING SURFACE POTENTIAL OF AN ELECTROSTATIC CHUCK

(75) Inventor: Gilbert Hausmann, Ben Lomond, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/208,668

(22) Filed: Dec. 10, 1998

(51) Int. Cl.$^7$ ............................................. H02H 23/00
(52) U.S. Cl. ......................................... 361/234; 361/115
(58) Field of Search ..................................... 361/234, 115

(56) References Cited

U.S. PATENT DOCUMENTS

| | | | |
|---|---|---|---|
| 5,436,790 | 7/1995 | Blake et al. | 361/234 |
| 5,539,323 | 7/1996 | Davis, Jr. | 324/690 |
| 5,642,056 | 6/1997 | Nakajima et al. | 324/758 |
| 5,670,066 | 9/1997 | Barnes et al. | 219/121.58 |
| 5,737,175 | 4/1998 | Grosshart et al. | 361/234 |
| 5,812,361 | * 9/1998 | Jones et al. | 361/234 |

FOREIGN PATENT DOCUMENTS

| | | | |
|---|---|---|---|
| 0 439 000 A1 | 7/1991 | (EP) | H02N/13/00 |
| 2 293 689 | 4/1996 | (GB) | H01L/21/68 |

* cited by examiner

*Primary Examiner*—Stephen W. Jackson
(74) *Attorney, Agent, or Firm*—Thomason, Moser & Patterson LLP

(57) ABSTRACT

An apparatus and method for actively controlling surface potential of an electrostatic chuck. The apparatus and method utilize a sensor and a control circuit. The sensor comprises an antenna on the chuck surface coupled to a field effect transistor (FET). The sensor produces a signal indicative of an electrical characteristic such as surface potential of the electrostatic chuck. The sensor signal provides feedback to the control circuit. The control circuit compares the sensor signal to a predetermined setpoint corresponding to a desired value of the surface potential. The control circuit provides a control signal to a power supply coupled to one or more chuck electrodes. The control signal causes the power supply to change the electrode voltage such that the resulting change in surface potential tends to null the difference between the sensor signal and the set point thus ensuring a constant chucking force.

16 Claims, 2 Drawing Sheets

APPARATUS AND METHOD FOR ACTIVELY CONTROLLING SURFACE POTENTIAL OF AN ELECTROSTATIC CHUCK

BACKGROUND OF THE DISCLOSURE

1. Field of the Invention

The invention relates to electrostatic chucks and, more particularly, the invention relates to in-situ measurement and control of a potential on the surface of an electrostatic chuck.

2. Description of the Background Art

Electrostatic chucks are used for holding a workpiece in various applications ranging from holding a sheet of paper in a computer graphics plotter to holding a semiconductor wafer within a semiconductor wafer process chamber. In semiconductor wafer processing equipment, electrostatic chucks are used for clamping wafers to a pedestal during processing. These chucks find use in etching, chemical vapor deposition (CVD), and physical vapor deposition (PVD) and other applications.

Electrostatic chucks secure a workpiece by creating an electrostatic attractive force between the workpiece and the chuck. A voltage is applied to one or more electrodes that are embedded in the chuck so as to induce opposite polarity charges in the workpiece and electrodes, respectively. The opposite charges pull the workpiece against the chuck, thereby retaining the workpiece. For example, in a "monopolar" electrostatic chuck, voltage is applied to a single conductive chuck electrode that is embedded within a dielectric or semiconductive chuck body. The magnitude of the chucking voltage is relative to some ground reference. When the voltage is applied, the workpiece is referred back to the same ground reference as the voltage source by a conductive connection to the workpiece. Electrostatic force is established between the workpiece being clamped and the electrostatic chuck. A "bipolar" electrostatic chuck generally contains two electrodes embedded within a unitary dielectric or semiconductive chuck body. When a chucking voltage is applied between the two electrodes, a small current flows between the electrodes and through the workpiece such that oppositely polarized charges respectively accumulate on the backside of the wafer and on the surface of the chuck body. These charges establish an electrostatic force, between the chuck and the workpieces via the Johnsen-Rahbek effect.

In either type of electrostatic chuck, a surface potential appears on the dielectric above the electrodes when a voltage is applied to the electrodes. The surface potential is directly proportional to the chucking force. For an ideal dielectric, the surface potential is equal in magnitude to the voltage on the underlying chuck electrode. Charging effects, polarization and other material specific phenomena can cause the surface potential on top of the dielectric to be different from the voltage on the underlying electrode. As a result, the performance (i.e., chucking force) of the chuck is affected. For example, some chucks exhibit a degradation of the surface potential over time after a chucking voltage has been applied to the chuck electrodes. This is believed to be due to the existence of low mobility charge carriers in the bulk dielectric material of the chuck. Other chucks exhibit a transient repelling force when the chucking voltage is turned off. This is due to repulsion of residual charges on the wafer backside by charges of like polarity induced on the chuck electrodes by a transient overpotential on the chuck electrodes when the chuck is turned off. The chucking performance varies in an unpredictable fashion from chuck to chuck. Furthermore, the behavior of a given chuck varies in an unpredictable fashion over time.

Active control of the surface potential requires that surface potential measurement be made in situ during wafer processing. Furthermore, reliable measurement and active control of the surface potential require that the surface potential be measured at a fixed location on the chuck surface in order to compare measurements of the surface potential taken over time. In the prior art, electrostatic probes and meters have been used to measure the surface potential of electrostatic chucks. Unfortunately, the probes used for these measurements are not suitable for the often harsh environment that exists inside semiconductor wafer processing chambers when the chamber is in use. Consequently, such probe measurements are not performed while the chamber is operating and therefore must be made in air, when the chamber is open, or when the chuck is removed from the chamber.

Therefore, a need exists in the art for an apparatus and method for reliably measuring and actively controlling electrostatic chuck surface potential during wafer processing.

SUMMARY OF THE INVENTION

The disadvantages associated with the prior art are overcome by the present invention of an apparatus and method for actively controlling the surface potential of an electrostatic chuck. The apparatus and method utilize a surface potential sensor and a control circuit. The sensor produces a signal indicative of an electrical characteristic such as a surface potential of the electrostatic chuck. The sensor signal provides feedback to the control circuit. The control circuit controls a high voltage power supply connected to one or more electrodes in the chuck such that the chucking voltage can be dynamically altered in response to the measured surface potential.

The sensor comprises an antenna, mounted to the chuck surface and a field effect transistor (FET). The antenna is coupled to a gate of the FET such that changes in the surface potential control a current between the source and drain of the FET. The source-drain current provides the sensor signal that is coupled to the control circuit. The control circuit compares the sensor signal to a predetermined setpoint corresponding to a desired value of the surface potential. In response to the sensor signal, the control circuit provides a control signal to the power supply that causes the chuck power supply to change the electrode voltage such that the resulting change in surface potential tends to null the difference between the sensor signal and the set point.

Active control of the surface potential provides a more reliable and reproducible chucking force. The present invention can be used to control the surface potential on a chuck having any number of electrodes and/or any type of chuck body material.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
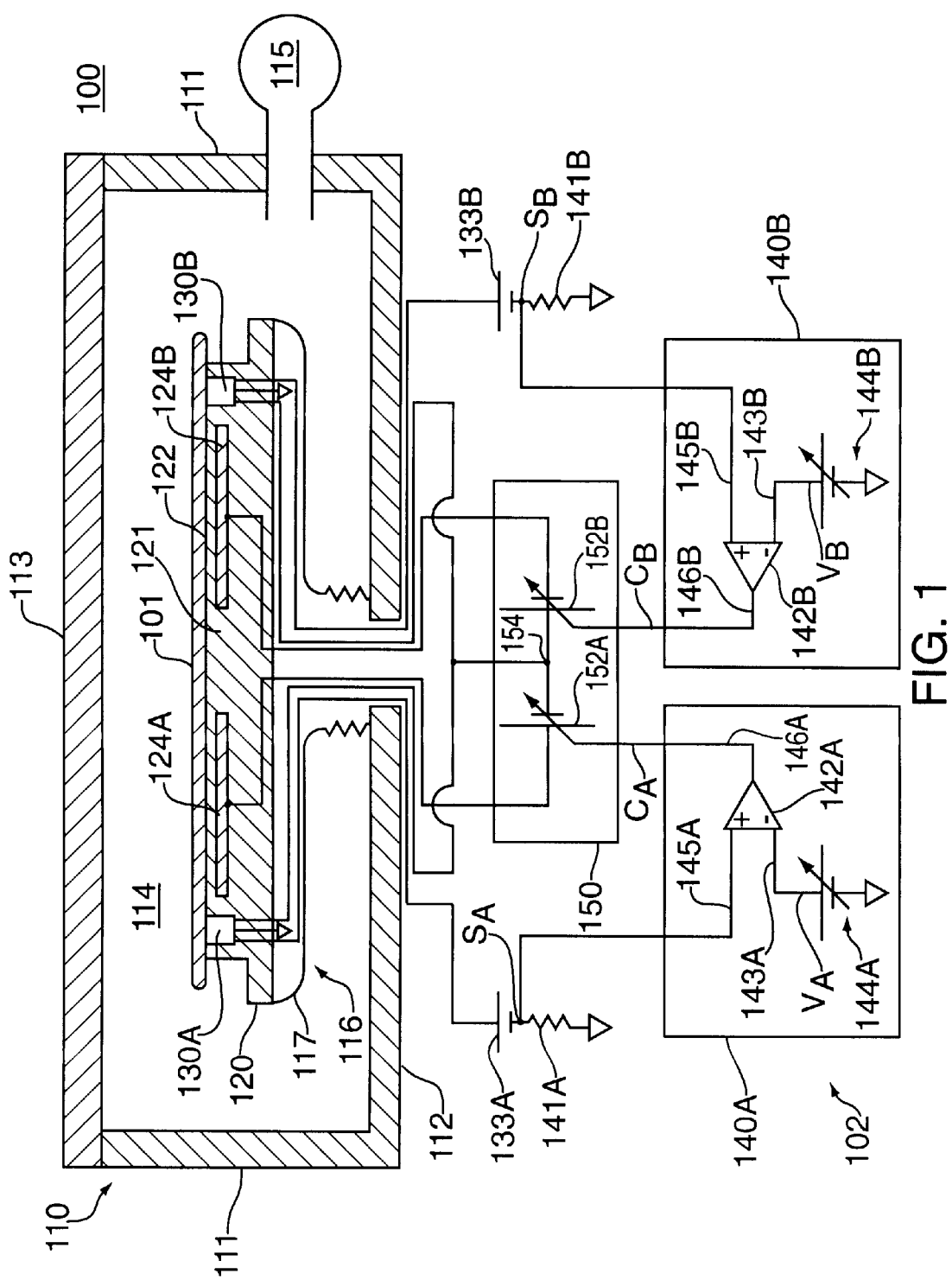
FIG. 1 depicts a schematic view of a semiconductor wafer processing system having a bipolar chuck that employs the apparatus of the present invention.

FIG. 1 depicts a schematic view of a semiconductor processing system 100 that includes the present invention. The system 100 generally comprises a processing chamber 110 that encloses a pedestal 116, where the pedestal 116 comprises a pedestal base 117 and an electrostatic chuck 120. The electrostatic chuck 120 is coupled to an apparatus 102 for actively controlling a surface potential of the electrostatic chuck 120. The processing chamber 110 comprises a set of walls 111, a floor 112 and a lid 113 that define a volume 114. The pedestal 116 is centrally disposed within the chamber 110. An exhaust system 115 evacuates the volume 114 to provide a suitable environment for semiconductor wafer processing. The chamber 110 can be any suitable chamber for any process requiring an electrostatic chuck. Such chambers include those used for etch, chemical vapor deposition (CVD), physical vapor deposition (PVD), ion implant, pre-clean and cool-down chambers. By way of example, the chamber 110 is a Preclean IIe chamber manufactured by Applied Materials of Santa Clara, Calif.

The electrostatic chuck 120 is supported in the chamber 100 by the pedestal base 116. The electrostatic chuck 120 generally comprises a dielectric (or semiconductive) body 121 having a support surface 122. The support surface 122 supports a semiconductor wafer 101 during processing. The electrostatic chuck 120 can be any type of chuck. The chuck 120 is, for example, a bipolar chuck that contains two chuck electrodes 124A and 124B embedded in a dielectric or semiconductive chuck body 121. Although a bipolar chuck 120 having two electrodes 124A and 124B is depicted herein, the semiconductor processing system 100 can employ a chuck 120 containing any number of chucking electrodes and any type of chucking electrode structure including monopolar, bipolar, tripolar, interdigitated, zonal and the like. The chuck body 121 is typically fabricated from a polymer material such as polyimide or a ceramic material such as aluminum oxide or aluminum nitride.

An electrode power supply 150 provides voltage to each of the electrodes 124A and 124B. Preferably the electrode power supply 150 is a voltage driven bipolar power supply that applies DC voltages of opposite polarity to each of the chuck electrodes 124A and 124B. The electrode power supply 150 comprises a pair of voltage sources 152A and 152B. The voltage sources 152A and 152B are referenced to a common center tap 154. Furthermore, the power supply 150 is a voltage controlled power supply wherein the voltage sources 152A and 152B are responsive to control signals $C_A$ and $C_B$ from the control circuits 140A and 140B.

The apparatus 102 for controlling the surface potential of the electrostatic chuck 120 comprises sensors 130A and 130B and control circuits 140A and 140B coupled to the electrodes 124A and 124B via the bipolar electrode power supply 150. The sensors 130A and 130B measure an electrical property of the chuck surface and produce sensor signals $S_A$ and $S_B$. The sensor signals $S_A$ and $S_B$ provide feedback to the control circuits 140A and 140B. The control circuits 140A and 140B, in turn, control the voltage sources 152A and 152B of the power supply 150. The sensors 130A and 130B can be any type of sensor that measures an electrical characteristic at the chuck surface 122 that is related to a chucking force exerted on the wafer 101. Suitable electrical characteristics include surface potential, electric field strength and electric field density. By way of example, the sensors 130A and 130B are surface potential sensors that produce signal voltages $S_A$ and $S_B$ that are proportional to the surface potential of the chuck 120.

Figure 2:
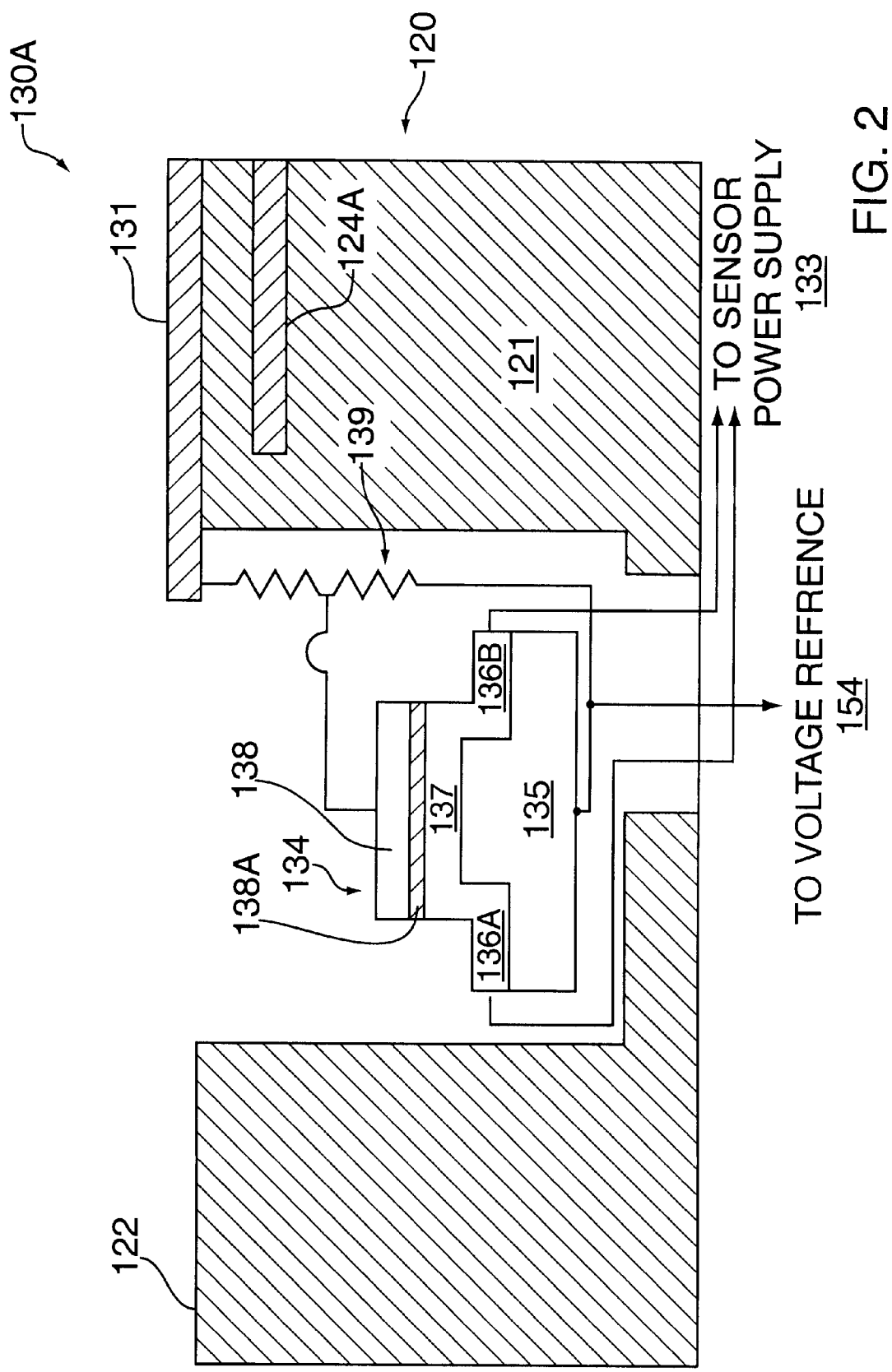
FIG. 2 a detailed view of a surface potential sensor according to the present invention.

Specific details of one of the sensors 130A, is depicted in FIG. 2. Each of the sensors 130A and 130B comprises a conductive antenna 131, mounted to the surface 122 of the electrostatic chuck 120 above one of the chuck electrodes 124. Preferably, the antenna 131 is made of a material such as aluminum or titanium, deposited onto the chuck surface 122 by sputtering through a mask or the like. The antenna 131, being conductive, acts as an equipotential probe, i.e., the electric potential (voltage) on the antenna is the same as the surface potential on the chuck surface 122 underneath the antenna 131. The antenna 131 is wired to an electronic device, such as a field effect transistor (FET) 134, for amplifying the antenna signal. Such FETs include enhancement mode and depletion mode FETs. Any type of field effect transistor or similar device can be used to amplify the signal from the antenna 131. For example, if the current from the antenna is sufficiently large, a bipolar transistor can be used in place of the FET 134. The FET 134 can be embedded into a depression 123 formed in the surface 122 of the chuck 120 and secured by an adhesive, such as a putty or glue, or a mechanical fastener such as a screw. The FET 134 can be fabricated as an integrated circuit chip by means well known in the art. Alternatively, the FET 134 can be fabricated onto the chuck surface 122 using surface mount technology.

The FET 134 comprises a semiconducting bulk layer 135, having doped source 136A and drain 136B regions connected by a channel 137 and a gate electrode 138 that is insulated from the channel 137 by an insulator layer 138A. A transverse electric field in the channel 137 controls a current between the source 136A and the drain 136B. The antenna 131 is connected to the gate electrode 138 and the bulk layer 135 through a voltage divider circuit 139. The voltage divider circuit 139 is embedded within the surface 122 of the chuck 120 and secured by means similar to those used to secure the FET 134. For example, the voltage divider circuit may be secured within a depression (not shown) in the surface 122 by an adhesive. The bulk layer 135 is coupled to a convenient voltage reference such as the center tap 154 of the electrode power supply 150. A sensor power supply 133 is coupled to the FET 134 to provide a voltage between the source 136A and drain 136B. If there is a constant voltage between the source 136A and drain 136B, the transverse electric field in the channel 137, and hence the source-drain current, is dependent of the voltage between the gate 138 and the bulk layer 135. The surface potential on the surface 122 of the electrostatic chuck 120, induces a voltage between the gate 138 and the bulk layer 135 that modulates the source drain current. The voltage divider circuit 139 reduces this voltage to a level suitable for controlling the FET 134, typically between 1 and 100 volts. Thus when the surface potential changes, the voltage between the gate 138 and the bulk layer 135 changes thereby controlling the current between the source 136A and drain 136B. The source-drain current flows though a resistor 141 to ground as shown in FIG. 1. To properly function, either the source 136A or the drain 136B must be connected to ground. The additional voltage provides the sensor signal $S_A$ that is coupled to the control circuit 140A.

Referring to FIG. 1, the control circuits 140A and 140B include, for example, comparators 142A and 142B and setpoint power supplies 144A and 144B. The comparators 142A and 142B have first inputs 143A and 143B coupled to the setpoint power supplies 144A and 144B, and second inputs 145A and 145B coupled to the sensor signals $S_A$ and $S_B$ (e.g., coupled between the sensor power supply 133A and the load resistor 141A), and outputs 146A and 146B coupled to the one of the voltage sources 152A or 152B of the electrode power supply 150. The setpoint power supplies 144A and 144B establish predetermined setpoint voltages $V_A$ and $V_B$, with respect to ground, that are related to desired surface potentials. The comparators 142A and 142B are, for example, operational amplifiers. The comparators 142A and 142B compare the sensor signals $S_A$ and $S_B$ to the predetermined setpoint voltages $V_A$ and $V_B$ and produce control signals $C_A$ and $C_B$ at the outputs 146A and 146B. The control signals $C_A$ and $C_B$ cause the voltage sources 152A and 152B to change the voltage applied to the corresponding electrode 124A or 124B thereby changing the surface potential in such a way as to null the difference between the sensor signals $S_A$ and $S_B$ and the setpoint voltages $V_A$ and $V_B$. More complex circuits, such as proportional integral differential (PID) circuits, can be utilized to control the voltage sources 152 of the power supply 150.

The present invention can be implemented using any number of sensors. For example, multiple sensors can be distributed across the surface of a chuck with multiple electrodes that provide multiple chucking zones. Each sensor provides feedback to control a voltage source for the corresponding electrode to overcome material related weakening of the chucking force in localized chucking zone on the chuck surface. The embedded sensors are also protected from the harsh environment in the chamber. The apparatus of the present invention provides for active control of the chucking force in response to changes in the surface potential. As a result, wafers are chucked more reliably and repeatably. Wafer processing is therefore more uniform and fewer wafers are defective. Fewer defective wafers means lower cost per wafer and increased profitability.

Although various embodiments which incorporate the teachings of the present invention have been shown and described in detail herein, those skilled in the art can readily devise many other varied embodiments that still incorporate these teachings.

What is claimed is:

1. Apparatus for retaining a workpiece, comprising:
   an electrostatic chuck having a surface for supporting said workpiece;
   a sensor having a transistor located proximate said surface to measure an electrical characteristic of said surface.

2. The apparatus of claim 1 wherein said sensor further comprises an antenna mounted on the surface.

3. The apparatus of claim 1 wherein said transistor is a field effect transistor.

4. The apparatus of claim 1 wherein said sensor measures an electrostatic potential of said surface.

5. The apparatus of claim 1 wherein the sensor is embedded in the surface of the electrostatic chuck.

6. An apparatus for actively controlling a surface potential on a surface of an electrostatic chuck having at least one electrode, comprising:
   a sensor having a transistor located proximate said surface that produces a sensor signal representing an electrical characteristic of said surface;
   a control circuit that produces a control signal in response to said sensor signal; and
   a power supply that generates a voltage that is responsive to said control signal, said voltage is coupled to said at least one electrode.

7. The apparatus of claim 6 wherein said sensor measures an electrostatic surface potential of said electrostatic chuck.

8. The apparatus of claim 6 wherein said sensor comprises an antenna mounted to said surface.

9. The apparatus of claim 6 wherein said sensor is a field effect transistor having a gate electrode coupled to said antenna.

10. The apparatus of claim 6 wherein said control circuit comprises a comparator coupled to said sensor and said at least one electrode, wherein a signal from said comparator controls a voltage output of said power supply.

11. A method for actively controlling a surface potential on a surface of an electrostatic chuck comprising the steps of:
   measuring an electrical characteristic with a sensor having a transistor proximate said surface;
   generating a signal indicative of said electrical characteristic;
   producing, in response to said signal, a voltage that is coupled to at least one electrode within said electrostatic chuck.

12. The method of claim 11 wherein said electrical characteristic is an electrostatic surface potential.

13. A semiconductor wafer processing system comprising:
   a processing chamber;
   an electrostatic chuck, disposed within said chamber, said chuck having a surface and at least one electrode;
   a power supply coupled to said at least one electrode;
   at least one sensor having a transistor proximate said surface for measuring an electrostatic surface potential of said surface; and
   at least one control circuit coupled to said power supply.

14. The semiconductor wafer processing system of claim 13 wherein said sensor further comprises an antenna mounted to said surface.

15. The semiconductor wafer processing system of claim 14 wherein said sensor is a field effect transistor having a gate, source, and drain electrodes, wherein said gate electrode is coupled to said antenna and a current between said source and drain electrodes is proportional to said surface potential.

16. The semiconductor wafer processing system of claim 15 wherein said control circuit comprises a comparator, having first and second inputs and an output, wherein said first input is coupled to a set point power supply, said second input is coupled to at least one of said source and said drain and said output is coupled to said power supply.

* * * * *